United States Patent [19]
Dahlberg et al.

[11] Patent Number: 4,675,784
[45] Date of Patent: Jun. 23, 1987

[54] PRINTED CIRCUIT BOARD

[76] Inventors: Rolf Dahlberg, Fördelningsgatan 17, S-633 41 Eskilstuna; Tomas Dahlberg, Junivägen 6E, S-632 22 Eskilstuna, both of Sweden

[21] Appl. No.: 770,874
[22] PCT Filed: Dec. 5, 1984
[86] PCT No.: PCT/SE84/00415
  § 371 Date: Aug. 12, 1985
  § 102(e) Date: Aug. 12, 1985
[87] PCT Pub. No.: WO85/02750
  PCT Pub. Date: Jun. 20, 1985

[30] Foreign Application Priority Data
Dec. 13, 1983 [SE] Sweden ............................. 8306874

[51] Int. Cl.$^4$ ............................................. H05K 7/20
[52] U.S. Cl. .................................. 361/386; 156/295; 156/309.6; 361/387
[58] Field of Search ............... 174/68.5; 361/386–388, 361/400–401, 414; 339/112; 156/253, 295, 309.6

[56] References Cited

U.S. PATENT DOCUMENTS

| | | | |
|---|---|---|---|
| 3,165,672 | 1/1965 | Gellert | 361/387 |
| 3,469,017 | 9/1969 | Thompson | 361/386 |
| 3,912,849 | 10/1975 | Thomas | 174/16 R |

FOREIGN PATENT DOCUMENTS

| | | | |
|---|---|---|---|
| 0090727 | 10/1983 | European Pat. Off. | 361/386 |
| 2741417 | 9/1977 | Fed. Rep. of Germany | 174/68.5 |
| 2743647 | 3/1979 | Fed. Rep. of Germany | 361/387 |
| 2097988 | 11/1982 | United Kingdom | 174/68.5 |

Primary Examiner—A. D. Pellinen
Assistant Examiner—Gregory D. Thompson
Attorney, Agent, or Firm—Fleit, Jacobson, Cohn & Price

[57] ABSTRACT

A printed circuit board having a supporting base element (1) of anodized aluminum. A glue film (4) is interposed between the supporting base element and a laminate layer (7) which has circuits (6a, 6b), the glue film sealing any pores in the anodic film of the supporting base element.

11 Claims, 2 Drawing Figures

PRINTED CIRCUIT BOARD

BACKGROUND OF THE INVENTION

1. Technical Field

The present invention relates to a printed circuit board, including a supporting base element in the shape of a heat removing metal plate or panel, one side of which has a laminate layer with at least one printed circuit.

2. Background Art

The manufacture of such printed circuit boards have caused problems because of the requirement that the heat removing plate must be electrically insulated. Efforts have been made inter alia to use circuit boards having a core of anodized aluminium, i.e. with an electrically insulating metal oxide film. Aluminium or steel plates covered with different types of resins have also been tested. These tests have not been very successful, for instance because of the formation of pores in the insulating film, thereby causing short-circuits between the metal plate and the electric circuit. If, on the other hand, the insulating film is made sufficiently thick in order to ensure that no pores are present, the ability of conducting away the heat from the circuit components will decrease.

SUMMARY OF THE INVENTION

The object of the present invention is, therefore, to propose a circuit board of the type described by way of introduction, in which the insulating material is a metal oxide film, which can be made relatively thin without any increasing risk of a short-circuit due to pore formation. This object is achieved by the circuit board in accordance with the invention.

The invention is based on the surprising discovery that metal oxide films—contrary to the prevailing experience—can be used as an electrically insulating film on heat removing plates in circuit boards without any risk of pore formation and short-circuit, if a glue film is provided between the metal oxide film and the laminate layer of the circuit board, the glue film suitably being of a nature or non-synthetic resin, i.e., a synthetic resin.

The invention will be described below in greater detail with reference to the accompanying drawing, which illustrates a preferred embodiment of the invention.

BRIEF OF THE DRAWINGS

DESCRIPTION OF THE PREFERRED EMBODIMENT

Figure 1:
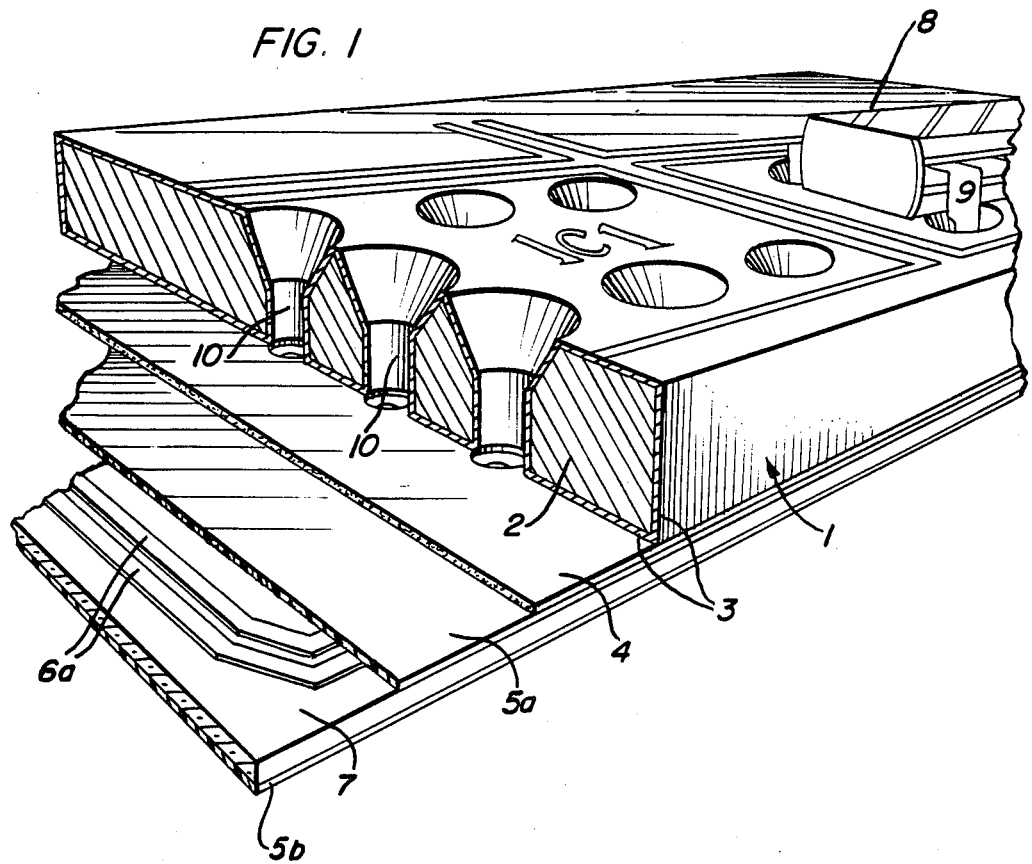
FIG. 1 shows a sectioned perspective view of a printed circuit board in accordance with the invention.

The printed circuit board includes a supporting base element 1 in the shape of a metal plate or metal panel 2 covered by an electrically insulating metal oxide film or coating 3. The metal plate 2 is, in the embodiment shown, of anodized aluminium, the anodized film of which constitutes the metal oxide film 3.

Figure 2:
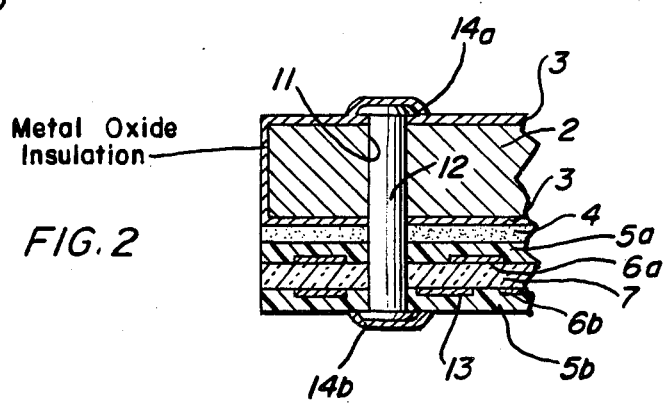
FIG. 2 shows schematically a cross section of a portion of a printed circuit board in accordance with the invention, illustrating the way in which the metal plate can be used as a screening of the circuit board.

The anodized metal plate 2 has on one side thereof, that is, the lower one in FIGS. 1 and 2, a glue film 4, an insulating varnish film 5a, an electric printed circuit 6a, an electrically insulating glass fiber laminate layer 7, an electric printed circuit 6b (shown in FIG. 2 only), and an insulating varnish film 5b, the layers and films being arranged in that order.

The laminate layer 7 the printed circuits 6a and 6b, and the varnish films 5a and 5b, are of known nature, for which reason they need not be further described here.

The electric components of the printed circuit board, which are for instance in the shape of IC-circuits 8, of which only one is shown in FIG. 1, are mounted on the free side of the plate 2, that is the upper side in FIGS. 1 and 2. It is important that the electric components 8 are in close contact with the upper side of the anodized plate 2 in order to ensure a thermally satisfactory contact between the components 8 and the plate 2, and a satisfactory heat conducting and heat spreading effect.

The components 8 are electrically connected to the circuits 6a and 6b via contact members 9. The contact members 9 extend through anodized, and thus insulated apertures 10 which are formed in the plate 2. The cross section area of the apertures 10 conically as seen in the direction towards the opening at the component side of the plate 2 in order to enable the contact members 9 to be completely lowered therein. By this way the components 8 can readily be mounted in close contact with the plate 2.

The anodized plate 2 can be connected to earth or, ground and it will then function as an electric screening, in spite of the fact that the outer film 3 of the aluminium plate is non-conductive. The ground connection is made through a non-anodized hole 11 in the circuit board, see FIG. 2. A pin or rivet 12 is in close contact with the conductive wall of the hole 11, and is electrically connected to one or several earth or ground conductors 13 in the circuits 6a and 6b. The free ends of the pin 12 are insulated by any known insulating varnish 14a and 14b, respectively.

The glue film 4 is suitably made of a natural or non-synthetic resin glue, or a synthetic resin glue, preferably a two-component glue, for example, a polyurethane glue of a polyether/polyester base and with polyisocyanide as hardener. Other similar glues are, however, suitable. The thickness of the glue film 4 should preferably be at least 10 $\mu$m in order to give a satisfactory pore sealing of the anodized metal oxide film 3. The thickness should also preferably be in the order of 10 to 50 $\mu$m, and more preferably in the order of 20 to 40 $\mu$m.

It has been shown that a pore sealing of the anodized metal oxide film 3 is obtained by means of the glue film 4, the sealing being so effective that any risk of a short-circuit between the plate 2 and the circuits 6a and 6b will be eliminated. Accordingly, the film 3 can be made very thin, for example on the order of 10 to 30 $\mu$m, without any risk of troublesome short-circuiting due to pore formation.

-The anodized plate 2 should have a thickness of about 3 to 10 times the thickness of the laminate layer 7. By this way, the circuit board will not be deformed when exposed to high temperatures.

The anodized metal oxide film may be colored in a suitable color, or it may be in its natural color.

By joining together the different layers and films of the circuit board, it is suitable to proceed in such a manner that the anodized plate 2 is manufactured as a separate unit, and that the laminate layer 7 together with the circuits 6a and 6b and the insulating varnishes 5a and 5b are manufactured as a second separate unit, which forms the actual circuit board. The two units are then joined together by the glue film 4.

It is of course conceivable within the scope of the invention to join the anodized plate 2 with a plurality of such "actual" circuit boards.

We claim:

1. A circuit board including a supporting base element in the shape of a heat dissipative metal panel having external anodized surfaces forming an electrically insulative oxide coating of good thermal conductivity, a laminate layer having at least one printed circuit, a heat emissive electrical component having a body portion which includes an exterior surface urged in direct physical contact against an insulative coating on said panel, and an electrically insulative glue film disposed between said laminate and said insulative oxide coating of said panel, said glue film sealing pores in said insulative oxide coating to prevent short circuits between said panel and said printed circuit.

2. The circuit board in accordance with claim 1, wherein the metal panel has at least one non-anodized hole, the wall of which is in electric contact with at least one ground conductor in the printed circuit.

3. The circuit board in accordance with claim 1 wherein the thickness of the glue film is at least 10 $\mu$m.

4. The circuit board in accordance with claim 3, wherein the thickness of the glue film is about 10–50 $\mu$m, preferably about 20–40 $\mu$m.

5. The circuit board in accordance with claim 1 wherein the thickness of the metal panel is about 3–10 times the thickness of the laminate layer.

6. The circuit board in accordance with claim 1 wherein contact members of said component are connected to the printed circuit and extend through electrically insulated holes in the metal panel.

7. The circuit board in accordance with claim 6, wherein the cross section area of each of said electrically insulated holes widens in a direction extending towards the component on the metal panel.

8. The circuit board in accordance with claim 1 wherein said glue film is formed from a non-synthetic resin.

9. The circuit board in accordance with claim 1 wherein said glue film is formed from a synthetic resin.

10. The circuit board in accordance with claim 1 wherein the glue film is formed a two-component glue.

11. The circuit board in accordance with claim 10 wherein the two-component glue is a polyurethane glue comprising a polyether/polyester base with a polyisocyanide hardener.

* * * * *